(12) United States Patent
Marques

(10) Patent No.: US 6,577,136 B1
(45) Date of Patent: Jun. 10, 2003

(54) MODULAR SELF-DIAGNOSTIC AND TEST SWITCH ASSEMBLY FOR CONTROLLING INVERTER OPERATIONS

(75) Inventor: Antonio Marques, Covington, GA (US)

(73) Assignee: Acuity Brands, Inc., Atlanta, GA (US)

( * ) Notice: Subject to any disclaimer, the term of this patent is extended or adjusted under 35 U.S.C. 154(b) by 0 days.

(21) Appl. No.: 10/128,937

(22) Filed: Apr. 23, 2002

(51) Int. Cl.[7] ............................................. G01N 27/416
(52) U.S. Cl. ............................. 324/426; 362/20; 315/86
(58) Field of Search ................................ 320/107, 127, 320/128, 135; 324/426; 315/86, 119, 307; 307/66, 64; 362/20

(56) References Cited

U.S. PATENT DOCUMENTS 6,285,132 B1 * 9/2001 Conley, III et al.
6,502,044 B1 * 12/2002 Lane et al.

* cited by examiner

Primary Examiner—Edward H. Tso
(74) Attorney, Agent, or Firm—Kenneth E. Darnell

(57) ABSTRACT

A modular self-diagnostic assembly for controlling diagnostic, charge and transfer functions necessary to operation of fluorescent emergency lighting packs also referred to as inverters or fluorescent battery packs used particularly in emergency lighting systems such as are configured for operation with fluorescent lighting fixtures and the like. Self-test/self-diagnostic circuitry contained within a module separate from an emergency lighting pack functions as an add-on accessory to existing emergency lighting packs without need for modification of structure or circuitry of the lighting pack. The self-diagnostic module of the invention connects electrically and mechanically to the lighting pack through appropriate leads terminated by an appropriate header and further connects mechanically and electrically to a test switch module through appropriate leads terminated by an appropriate header. The resulting physical assembly is modular in concept with a first housing containing the conventional emergency lighting pack, or inverter, a second housing separate from the first housing and containing circuitry for controlling diagnostic, charging and transfer functions, the self-diagnostic module contained by the second housing connecting to the test switch module. Particular circuitry which can be incorporated into the self-diagnostic module provides control and self-test functions although other circuitry capable of appropriate function can be contained within the self-diagnostic module.

10 Claims, 6 Drawing Sheets

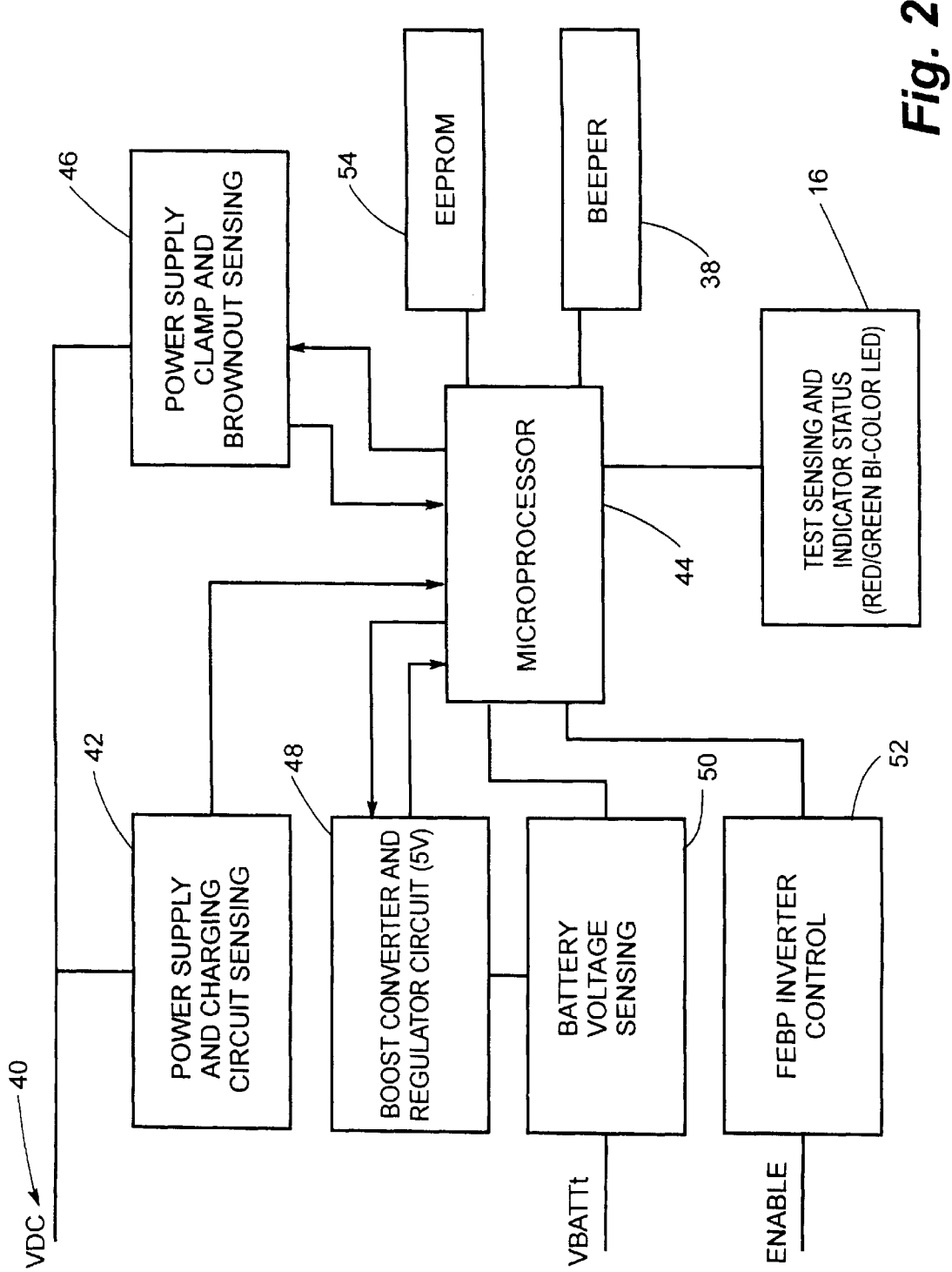

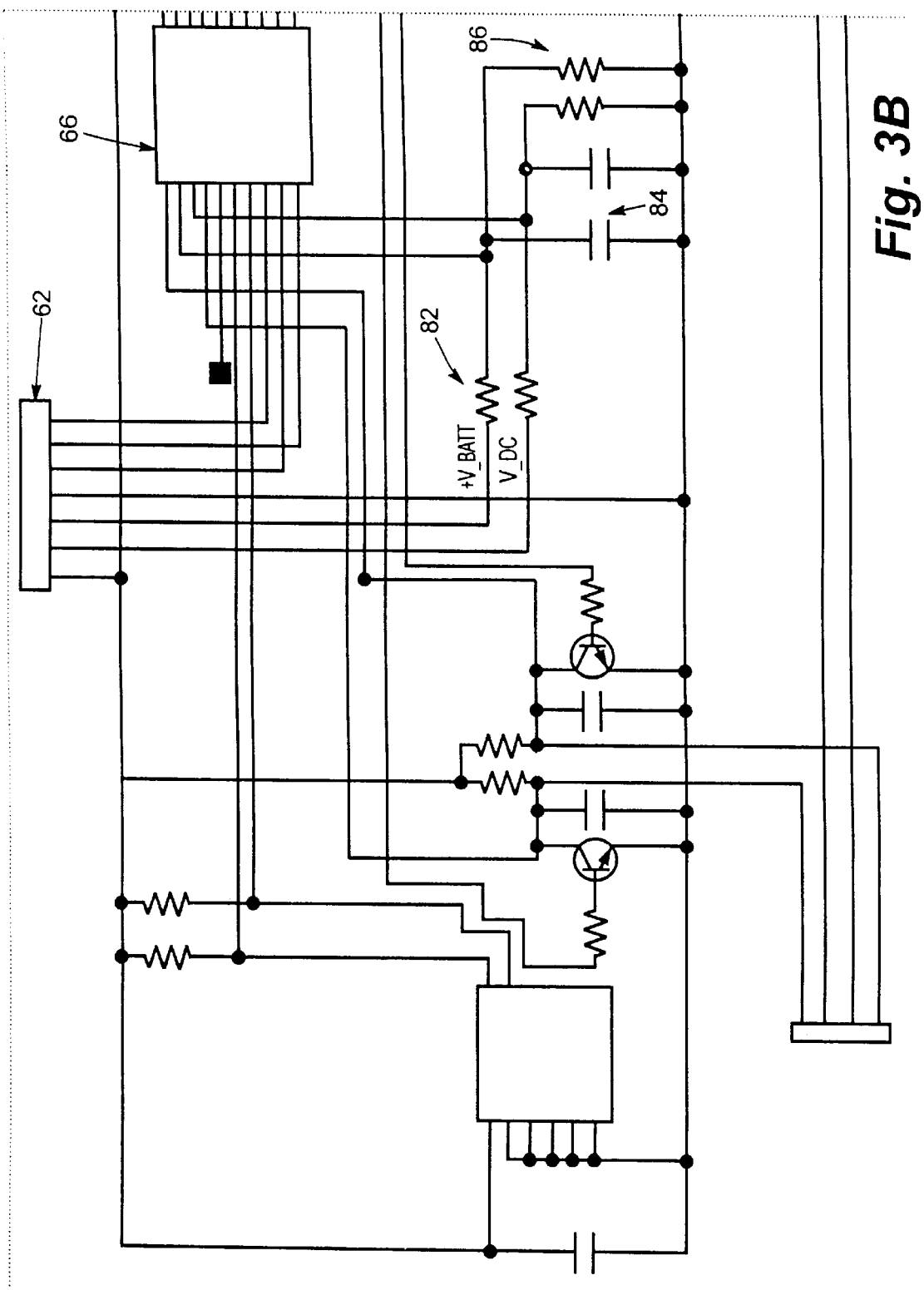

MODULAR SELF-DIAGNOSTIC AND TEST SWITCH ASSEMBLY FOR CONTROLLING INVERTER OPERATIONS

BACKGROUND OF THE INVENTION

1. Field of the Invention

The invention relates generally to self-test and/or self-diagnostic systems used with emergency battery packs which provide emergency functions for lighting fixtures including fluorescent lighting fixtures, the invention particularly relating to a modular self-diagnostic assembly configured as an add-on accessory for existing emergency lighting packs without the need for modification of such packs.

2. Description of the Prior Art

Standard lighting fixtures such as fluorescent lighting fixtures are commonly provided with an emergency lighting capability by installation of appropriate inverter circuitry in the form of "battery pack" systems as are described inter alia in U.S. Pat. No. 5,202,608 and 5,814,971 to Johnson, these patents being subject to assignment to the present assignee, Acuity Brands, Inc., of Atlanta, Ga., doing business in the lighting industry under the name of Lithonia Lighting. The patents to Johnson describe circuitry embodied in fluorescent emergency battery packs known in the industry under the trademark "Power Sentry", the present invention being configured to provide a self-test or self-diagnostic function to the emergency battery packs of the Power Sentry series as well as to emergency battery packs generally as are known in the art. The ability to test and perform diagnosis of failures in such battery packs has become a desirable practice in the industry. Previously available self-test or self-diagnostic capability has taken the form of circuitry incorporated into the emergency lighting pack itself, this prior circuitry typically acting to test proper function of inverter circuitry including charging circuitry as well as battery and lamp status. Such circuitry typically functions through use of a test switch electrically connected to the circuitry which is to be tested so that a test button or the like can be manually operated to accomplish the testing function. Timing circuitry of conventional configuration is also known in the art for automatically performing testing and diagnostic functions at specified intervals, such circuitry typically being integrated into the emergency pack and being configured within a common housing containing inverter and other circuitry comprising the emergency pack. Integration of testing and/or diagnostic circuitry directly into that circuitry comprising the inverter function and housed by a single housing has required modification to such emergency battery packs both structurally and electrically. Retrofitting of existing packs with self-diagnostic circuitry has been difficult at best in prior art practice in view of the necessity for modification of existing packs to accommodate such circuitry. A need has thus existed in the industry for an advance that allows an emergency capability to be provided to a standard lighting fixture through installation of an emergency pack to which a self-diagnostic function can be incorporated without the need for modification of the pack. This need exists in newly installed lighting systems as well as in retrofit situations where lighting fixtures are already in place having emergency packs operable with such fixtures.

Conventional fluorescent emergency lighting packs ordinarily provide for manual testing of such packs by means of an externally connected test switch and indicator lamp electrically connected to a high voltage AC power input of the pack. Operation of such a test switch simulates a power failure so that a user can test and confirm operation of the pack under the simulated conditions of an emergency, that is, the loss of mains power. Such conventional indicators verify that a battery of a conventional pack is in a charging state. Indicators of this type are located within the emergency pack housing except for at least a portion of the indicator lamp which extends from the pack at a location convenient for viewing by a user who is manually testing the pack. As described in U.S. patent application Ser. No. 09/865,913, filed May 24, 2001, the patent application being subject to an assignment to Acuity Brands, Inc., a test switch and indicator is provided with a separate housing externally of the pack housing and is connected electrically and mechanically through insulated leads and a suitable connector to an emergency pack, the switch and indicator being electrically connected to a low voltage portion of the emergency pack as dictated in the pending patent application identified above, the test switch and indicator being mounted on a printed circuit board and contained by an appropriate housing which is preferably formed of a plastic material. The connector described in the patent application also acts to enable inverter circuitry of the emergency pack for emergency operation and further to prevent the pack when the connector is not connected to the pack from operating in the event AC power is not present. The invention of the patent application reduces product cost and simplifies external wiring.

A prior emergency lighting system embodying the teachings of U.S. Pat. No. 5,416,384 to Bavaro incorporates a battery module and a power module, the power module acting to operate a lamp when AC mains power is available to the lighting system while the battery module drives lamping when AC mains power is absent such as occurs during emergency conditions. This prior lighting system does not provide the advantages occasioned by the present invention in that a self-test and/or self-diagnostic module is not provided by the prior system. The prior system does not therefore provide the capability of incorporating a self-test and/or self-diagnostic function into an existing emergency lighting pack without modification to the pack whether in a new installation or in a retrofit situation.

Accordingly, the present invention provides utility not found in existing emergency lighting systems by providing teachings including dense multi-board assembly, large product packaging, dedicated product formats and the ability to upgrade previously installed packs with self-test and/or self-diagnostic capabilities. The present invention provides advantages not previously available in the art through embodiment of a modular system concept wherein self-test and/or self-diagnostic circuitry is contained within a module housing and connected through a lead and connector assembly to a low voltage portion of an existing emergency pack, the self-test/self-diagnostic module being further connected by a lead and connector assembly to a test switch and indicator module contained by a housing separate from the module housing containing the self-test and/or self-diagnostic circuitry. While the modular concept of the invention can include various self-test and/or self-diagnostic circuitry including known circuitry, the invention is preferably provided with circuitry particular to the invention for control and other functions including power conversion, boost enable and automatic self-configuration on determination of the nature of a battery forming a portion of an emergency pack.

SUMMARY OF THE INVENTION

The invention provides in a modular form self-test and/or self-diagnostic circuitry contained within a housing and forming a portion of an emergency lighting system and having the ability to impart self-test/self-diagnostic function to emergency lighting packs used to incorporate emergency capability into standard lighting systems. According to the invention, a housing containing the self-test and/or self-diagnostic circuitry is separate from structure housing circuitry and components of an emergency lighting pack to which the self-test and/or self-diagnostic circuitry adds the testing and/or diagnostic function. Functions including charging and transfer functions are also provided by circuitry housed within the diagnostic module, the diagnostic module being an add-on accessory to existing emergency lighting packs without the need for modification of such lighting packs.

The diagnostic module of the invention further provides particular circuitry contained within the diagnostic module for accomplishment of diagnostic and control functions although it is to be recognized that conventional or other circuitry capable of providing necessary diagnostic, control and other functions can be utilized as the circuitry contained in the diagnostic module of the invention. Functions produced by circuitry contained within the diagnostic module of the invention include performance of manual or scheduled tests such as by means of low voltage operation, cooperation with a test switch and indicator lamp located externally of the diagnostic module, conversion of battery voltage levels present in battery structures housed within an emergency lighting pack to a regulated DC voltage of a predetermined level, detection of the on and off state of lamping of the lighting system for postponement of scheduled tests, and automatic self-reconfiguration for operation with battery structures of differing voltages.

The diagnostic module of the invention operates in concert with a separately contained test switch and indicator lamp external of the module and connected to the module by conventional leads and a connector. The test switch and indicator lamp permit manual testing of the emergency lighting pack through connection with the diagnostic module to produce a visual indication of the operational worthiness of the pack.

Accordingly, it is an object of the invention to provide a self-contained module capable of accomplishment of self-test and/or self-diagnostic and other functions indicative of an acceptable potential for operation of an emergency lighting pack or emergency battery pack which imparts an emergency capability to standard lighting fixtures and particularly to ballasted fluorescent lighting fixtures, the module being separate from the pack and connectable to the pack without modification of the pack, thereby permitting incorporation of the test and diagnostic functions to packs installed as original equipment or as retrofitting to a previously installed pack.

It is another object of the invention to provide a modular system incorporating the functions of an emergency battery pack within a first module, self-test and/or self-diagnostic as well as control and other functions within a second module, and a test switch and indicator lamp module, the modules being interconnected by appropriate leads and connectors and functioning to impart an emergency capability to standard lighting fixtures.

It is a further object of the invention to provide control functions within a diagnostic module which are provided through the agency of one or more microprocessors to convert battery voltage levels within a given range to a regulated DC voltage of a predetermined level.

It is yet another object of the invention to provide a diagnostic module with the ability to automatically reconfigure itself to operate with emergency lighting packs having differing battery voltages.

It is a still further object of the invention to provide a self-contained module capable of accomplishment of self-test/self-diagnostic and other functions indicative of an acceptable potential for operation of an emergency lighting pack, the module containing particular circuitry capable of test, diagnostic, control and other functions necessary and desirable to operation of the emergency pack and the lighting fixture to which the pack imparts emergency capability.

It is another object of the invention to provide a self-contained module capable of accomplishment of self-test/self-diagnostic and other functions indicative of an acceptable potential for operation of an emergency lighting pack which comprises any useful circuitry capable of necessary and desirable functioning of the pack and the lighting fixture to which the pack imparts emergency capability.

Further objects and advantages of the invention will become more readily apparent in light of the following detailed description of the preferred embodiments.

BRIEF DESCRIPTION OF THE DRAWINGS

FIG. 2 is a block diagram illustrating components of the diagnostic module and emergency lighting pack and test switch of FIG. 1 in an operational interrelationship;

FIGS. 3A, 3B and 3C each form portions of a schematic of the system shown generally in FIG. 2; and, FIG. 4 is a circuit diagram illustrating electrical connection of the diagnostic module and test switch to inverter circuitry with which the invention finds utility.

DESCRIPTION OF THE PREFERRED EMBODIMENTS

Figure 1:
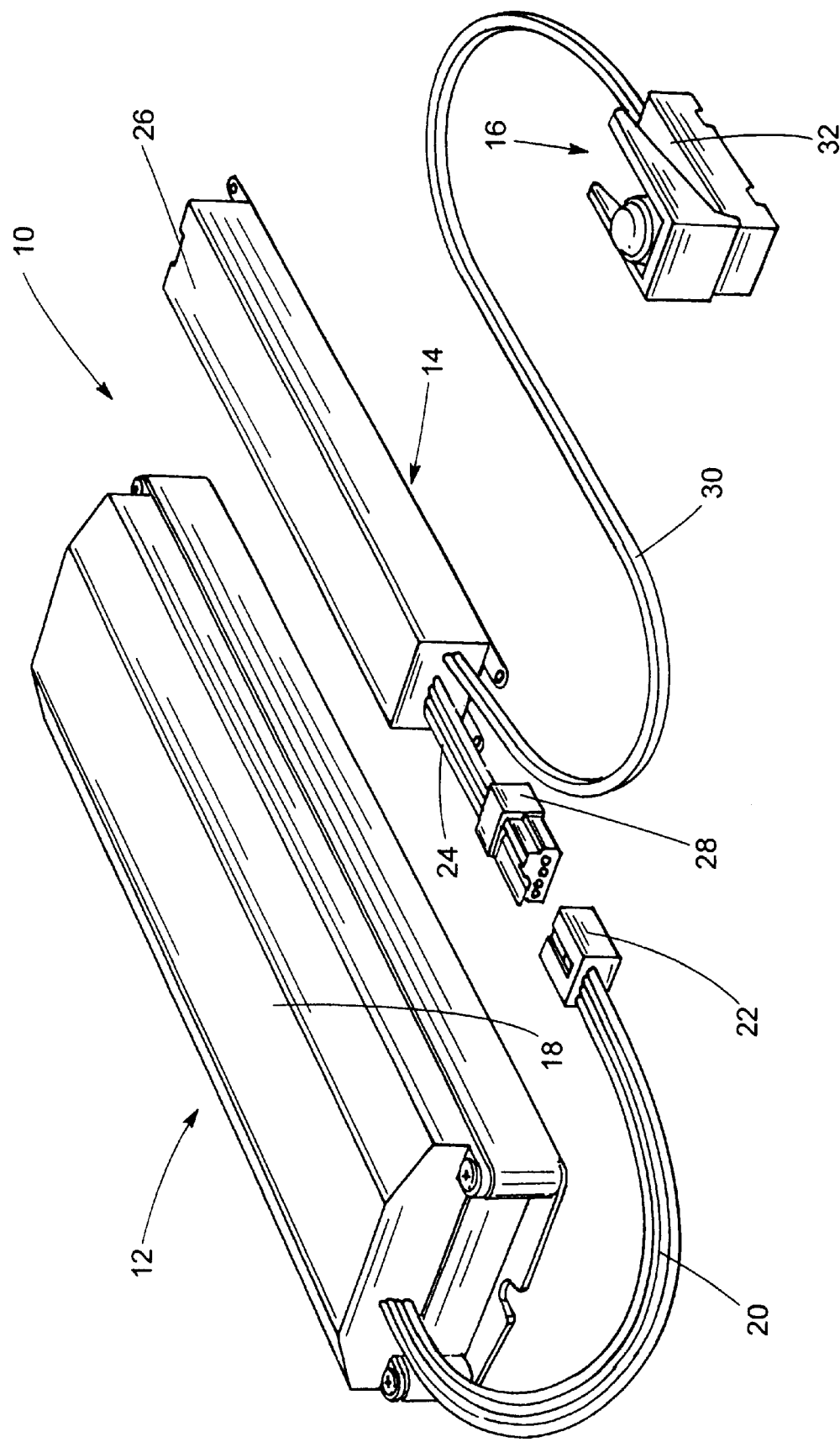
FIG. 1 is an idealized perspective view of a diagnostic module of the invention operatively associated with an emergency lighting pack and a test switch and indicator lamp as a portion of a system capable of installation with standard lighting fixtures either as original equipment or retrofitted to impart an emergency capability to the standard lighting fixture.

Referring now to FIG. 1, a system capable of providing an emergency lighting function to a standard lighting fixture (not shown) is seen at 10 to comprise an emergency lighting pack 12, often referred to in the art as an emergency battery pack, a diagnostic module 14 and a test switch and pilot light indicator 16. The emergency lighting pack 12 can take the form of the circuitry described inter alia in U.S. Pat. Nos. 5,202,608 and 5,814,971, the disclosures of these patents being incorporated hereinto by reference. Emergency lighting packs such as the pack 12 are conventionally used to provide an emergency lighting function to standard lighting fixtures and particularly to fluorescent lighting fixtures operable with either magnetic or electronic ballasts (not shown). The lighting pack 12 conventionally comprises a pack housing 18 which contains inter alia inverter circuitry and at least one battery and is conventionally mounted to or in association with a conventional lighting fixture operated in a known fashion through a ballast device by AC mains power. On discontinuation of normal power to the fixture, the pack 12 functions to recognize the absence of AC power and to convert operation of the fixture from normal AC power to DC typically provided by a battery (not shown) contained within the pack housing 18.

The emergency lighting pack 12 is provided conventionally with a four-wire insulated lead 20 which extends from the pack housing 18 and terminates in a conventional connector 22. The lead 20 contains four wires (not seen in FIG. 1) that connect to circuitry located internally of the pack housing 18 as will be described hereinafter. The diagnostic module 14 is provided with a first four-wire insulated lead 24 which extends from module housing 26 and terminates in a conventional connector 28, the connector 28 mating in a conventional manner with the connector 22 terminating the lead 20 of the lighting pack 12. The diagnostic module 14, even though referred to only as the "diagnostic" module for simplification of reference, should be understood to include functions including but not limited to self-test functions, self-diagnostic functions, control functions and other functions as well as combinations thereof as will be apparent from the context and particular description herein provided. The diagnostic module 14 contains circuitry and components thereof within the module housing 26 that provide the aforesaid functions to the lighting pack 12 without the need for modification of the lighting pack. Cost reduction, inventory reduction and standardization are thus accomplished through modular configuration of the diagnostic module 14 and of the system as described herein. The existence in the present system of the diagnostic module 14 having the functional capabilities described herein negates the requirement for modification of existing lighting packs such as the pack 12 as has been necessary in practices of the prior art for incorporation of circuitry and the like necessary to produce such functions into the pack 12 itself. In essence, the testing, diagnostic, control and other functions provided by the circuitry contained within the diagnostic module and associated therewith can be accomplished through use of an add-on accessory which takes the form of the diagnostic module 14.

The diagnostic module 14 is further provided with a two-wire insulated lead 30 which extends from the module housing 26 and terminates in the test switch and pilot light assembly 16 which is of modular conformation by virtue of containment essentially within indicator housing 32. The test switch and pilot light indicator 16 preferably takes the form of one of the structures described in copending U.S. patent application Ser. No. 09/865,913, filed May 24, 2001 and entitled "LED Test Switch and Mounting Assembly", and subject to an assignment to Acuity Brands, Inc., the disclosure of Ser. No. 09/865,913 being incorporated hereinto by reference. Prior art indicator assemblies such as are described in Ser. No. 09/865,913 as well as other indicator structure suitable for function in the manner intended for cooperation with the diagnostic module 14 and the lighting pack 12 can be used as the indicator 16. Further description of the indicator 16 is not necessary herein due to the disclosure provided by the aforesaid copending patent application. In use with the system 10 of this invention, the indicator 16 when utilized as intended provides a visual indication of the operational worthiness of the lighting pack 12 inter alia. In the aforesaid copending patent application, indicators which can function as the indicator 16 are provided for direct connection to a lighting pack such as the pack 12 to provide a manual test function as described in said patent application, such function being absent a self-test or self-diagnostic capability as is provided by the system 10 of this invention. In the system 10 of the present invention, the indicator 16 is capable of low voltage operation from low voltage provided to the indicator 16 through the diagnostic module 14 which in turn is powered by connection through the lead 20 to a low voltage portion of the pack as will be described hereinafter.

Figure 3A:
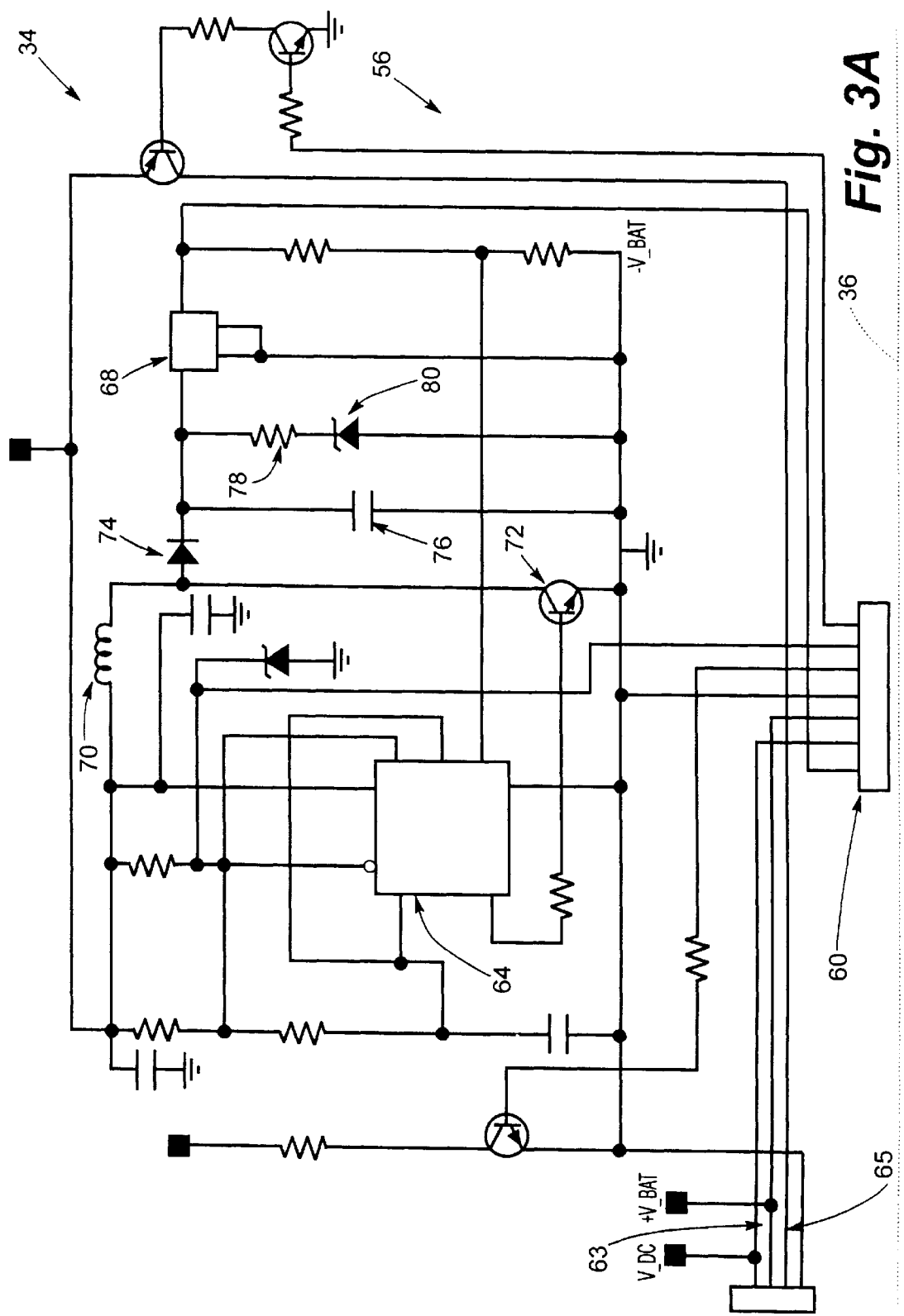
Figure 3C:
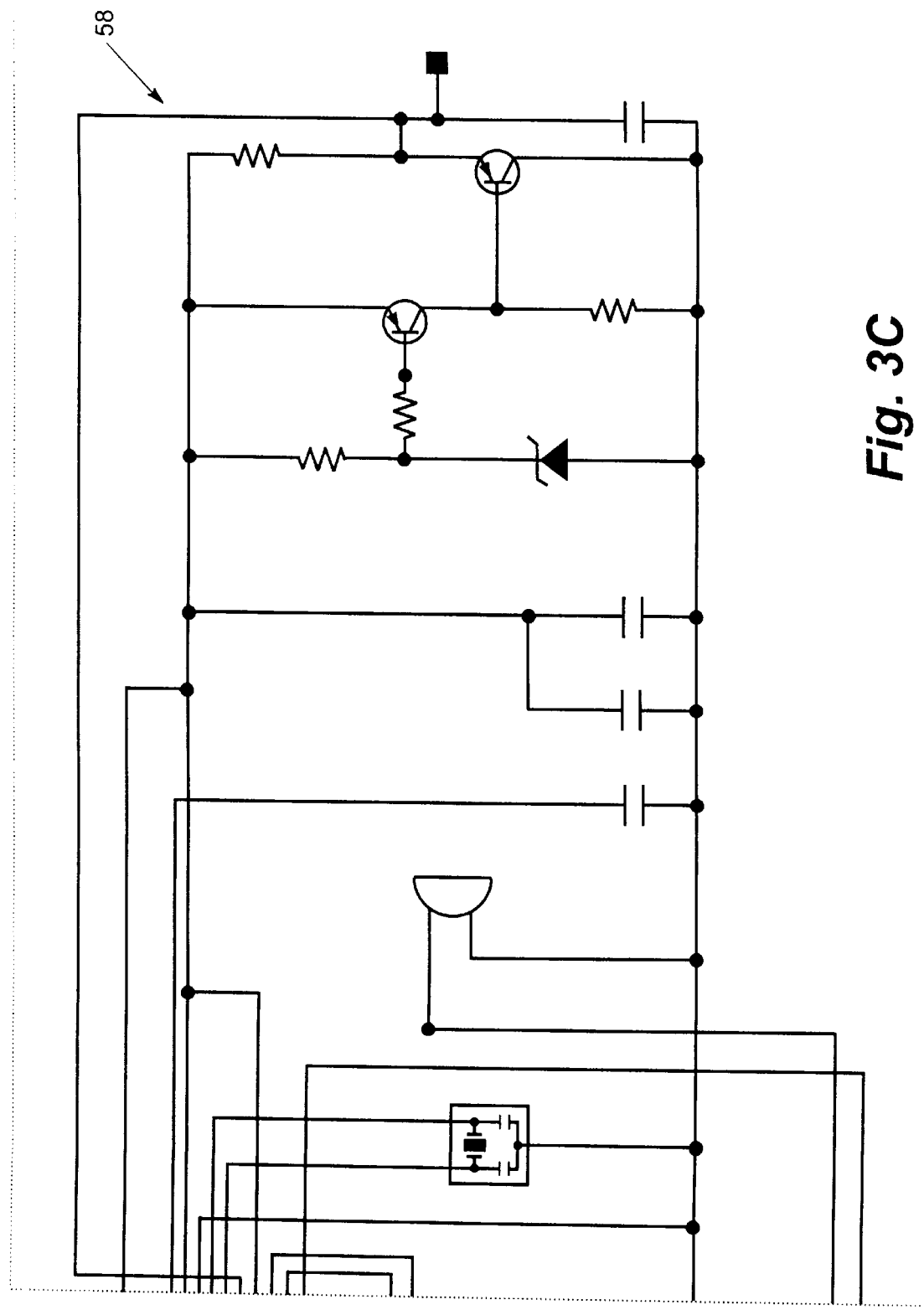

Circuitry of particular configuration which can be advantageously contained within the diagnostic module 14 is shown generally in FIGS. 3A, 3B and 3C, the circuitry being too extensive to be shown on a single pace, the circuitry being referred to as circuitry 34 and encompassing the circuitry of FIGS. 3A, 3B and 3C as continuously operable circuitry. The circuitry 34 is located on a divided circuit board represented by a board perforation line at 36, the circuit board being illustrated by the line 36 to represent separation of the circuit board into two essentially equal parts allowing stacking of said parts to provide volumetric efficiency within the confines of the module housing 26. The circuitry 34 of FIGS. 3A, 3B and 3C is described generally in relation to FIG. 2 as a part of the system 10 comprising the pack 12 and the indicator 16. Particular description of the circuitry 34 of FIGS. 3A, 3B and 3C will be provided hereinafter following description of the system 10 as functionally seen in the diagram of FIG. 2.

The system 10 of the invention is generally shown in FIG. 2 absent a representation of the lighting pack 12 which is conventional. FIG. 2 generally illustrates the circuitry 34 contained within the diagnostic module 14 as well as the indicator 16 as seen in the illustration. With the exception of the indicator 16 and beeper 38, the remaining representational blocks of the diagram of FIG. 2 are circuits, circuitry components or representations of function incorporated into the circuitry 34 contained within the diagnostic module 14. Low voltage DC seen at 40 by the module 14 is provided for operation of said module 14 by connection of the module to the lighting pack 10 (not shown in FIG. 2). Circuitry is provided at 42 for sensing power supply and charging current applied to a battery (not shown in FIG. 2) located in the lighting pack 12, the lighting pack 12 as aforesaid not being shown in FIG. 2. Input from the sensing circuitry 42 is provided to microprocessor 44 which controls circuitry seen at 46, the circuitry 46 functioning as a power supply clamp and for sensing of brown-out conditions. A boost converter and regulator circuit 48 provide input to the microprocessor 44 which utilizes input thereto to control the circuit 48 in part in order to provide a regulated DC voltage, such as 5 volts, even though battery voltage levels can vary within a range such as from 2 to 8 volts. The circuit 48 is capable of a power converting function which provides regulated DC voltage. The circuit 48 functions with input from battery voltage sensing circuitry 50 for connection to a battery (not shown in FIG. 2) contained within the lighting pack 16, the circuitry 50 sensing the voltage of such a battery and supplying input also to the microprocessor 44. An enabling function is provided by FEBP inverter control circuitry seen at 52, the circuitry 52 connecting to the lighting pack for control of inverter circuitry (not shown in FIG. 2) contained within the lighting pack 12. The circuitry 52 is controlled in turn by the microprocessor 44. Control of EEPROM 54 is also provided by the microprocessor 44, the EEPROM 54 being a memory device capable of storing configuration variables necessary for decision formulation, the logging of stored variables for providing records of brown out and other events, low voltage disconnection, failures, etc. The EEPROM 54 maintains a library of information even in the absence of battery or AC power. The circuitry 34 embodies the capability of detecting the on or off state of lamping (not shown) of a lighting fixture (not shown) with which the system 10 functions to provide an emergency lighting capability, detection of the state of such tamping enabling postponement of scheduled testing. The circuitry 34 further enables reconfiguration of itself automatically to operate with particular lighting packs represented by the lighting pack 12, such packs having batteries of differing voltages and configurations as represented by 3.6, 4.8, 6.0 battery models as well as higher voltage battery models.

Referring now again to FIGS. 3A, 3B and 3C, the circuitry 34 which is preferably contained within the diagnostic module 14 is seen in detail. It is to be understood that diagnostic circuitry of differing description can be utilized as circuitry contained within the module 14, said circuitry being capable of various testing, diagnostic, control and other functions as are necessary and desirable for operating and being operational with a lighting pack such as the lighting pack 12 and such as can find utility within the concept of the system 10.

That portion of the circuitry 34 carried on one-half of the circuit board represented by the board perforation line 36 is conveniently referred to as circuit 56 while that portion of the circuitry 34 carried by the other half of the circuit board and providing control functions is conveniently referred to as circuit 58. The circuits 56 and 58 are electrically interconnected through board-to-board ribbon cables 60 and 62, each conductor of each of the ribbon cables 60 and 62 being respectively numbered for connection to like-numbered pin locations of microprocessors 64 and 66 the microprocessor 66 provides a timing function and is set for astable operation with control pin 5 thereof having a portion of the DC voltage regulated to a constant voltage such as 5 volts. The microprocessor 66 thus comprises a portion of a fixed frequency unregulated pulse width modulator which comprises a power converter wherein the modulator is configured for boost operation with linear low voltage dropout regulator 68. The boost conversion function is provided by inductor 70, transistor switch 72, diode 74 and filter capacitor 76. The boost converter so configured is enabled through astable operation of the timer function of the microprocessor 64 to vary boost ratio by a function of two to three. Linear regulation provided by the microprocessor 64 provides for the desired 5 volt DC output for microprocessor and support circuitry. Resistor 78 and zener diode 80 form an active load to limit boost voltage under no-load conditions. Reset pin 4 of the microprocessor 64 is used to enable boost conversion function depending on battery voltage level as sensed by the microprocessor 66 by means of resistor 82, capacitor 84 and resistor 86, thereby allowing shutdowns of the boost conversion function when adequate battery voltage is detected and a default boost operation during initial power is realized. The on or off state of lamping (not shown) of a lighting fixture (not shown) to which emergency function is provided by the system 10 of the invention is accomplished through the ability of the microprocessor 64 to detect internal body diode temperature which is a function of the temperature rise of the lamping. The temperature detection thus provided is processed by software to determine whether the lamping is in an on or off condition. Sensing of battery voltage is processed through software programmed conventionally into the microprocessor 64 so that the microprocessor 64 after a predetermined time and testing schedule can determine the type of battery according to voltage which is present in the lighting pack 12.

Figure 4:
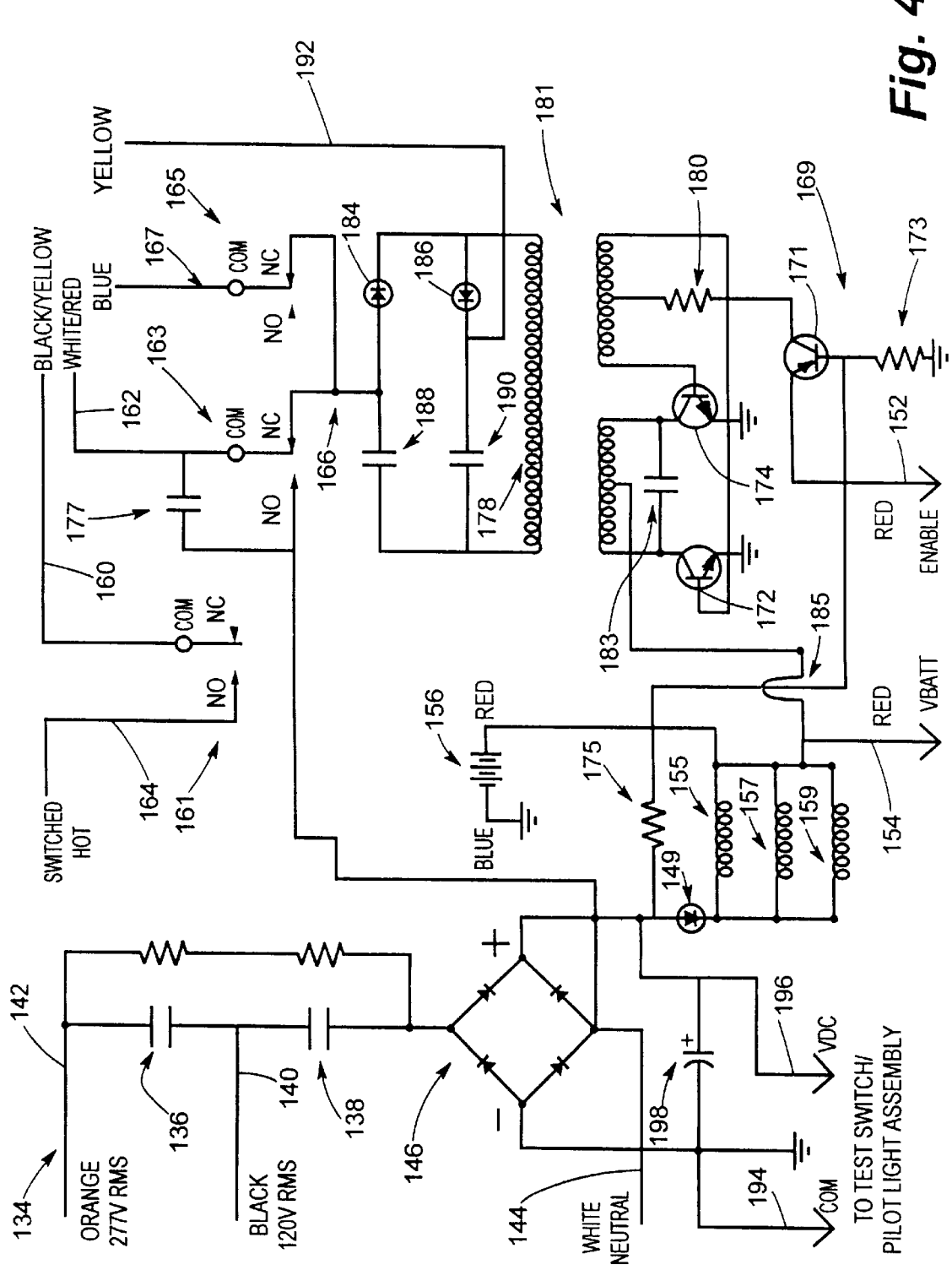

Referring now to FIG. 4, it is to be seen at 81 that an inverter circuit identical to the circuit shown in FIG. 1 of U.S. Pat. No. 5,814,971 is reproduced with the exception that the numerals of the Figure of U.S. Pat. No. 5,814,971 are each modified by inserting the numeral "1" before each of the numerals as seen in 5,814,971. As an example, the numeral "60" of 5,814,971 is thus converted to numeral "160" in FIG. 4. The inverter circuitry of FIG. 4 is provided herein to indicate the locations of the circuitry to which the wires of the lead 20 are electrically connected. As is indicated in FIG. 4, wires 194 and 196 of inverter circuitry 181 connect through the lead 20 of FIG. 1 with the two-wire lead 30 via the diagnostic module 14 to the indicator 16. The other two wires of the four-wire lead 20 connect to the "RED" wires of FIG. 4 and electrically connect through the connectors 22, 28 with the circuitry 34 of the diagnostic module 14. Connection of red wire 152 is to battery enable line 65 of the circuit 34 while connection of the red wire 154 from the pack 12 is to line 63 of the circuit 34, the line 63 carrying positive battery voltage. Sensing of AC line voltage is accomplished through the relay coils 155, 157 and 159 of a relay formed by said coils. Inference of AC line voltage and charge current is the differential between $V_{BATT}$ and $V_{ENABLE}$ as indicated in FIG. 4. The inferred voltage and characteristics of the relay formed by the coils 155, 157 and 159 infers charge current. Control function is thus accomplished and a steady voltage is provided to the microprocessors 64 and 66 of the circuit 34.

It is to be understood that the invention can be practiced other than as explicitly shown and described herein without departing from the scope of the invention as intended and as recited in the appended claims.

What is claimed is:

1. In an emergency lighting system having at least one lighting fixture, a battery, an inverter circuit for converting direct current provided by the battery to alternating current to power the lighting fixture in the event of failure of mains power, and a test switch for manual actuation to initiate testing of system components, the improvement comprising:
   a module containing test circuitry capable of performing testing, diagnostic and/or charge and transfer functions, the test circuitry being actuated by manipulation of the test switch of automatically to perform predetermined test functions; and,
   means for electrically and physically connecting the module to the inverter circuit from externally of the inverter circuit, the module taking the form of an add-on unit to the lighting system and being functional therewith without modification of the inverter circuit or of the lighting fixture.

2. In the emergency lighting system of claim 1 wherein the inverter circuit is contained within a second module disposed in operational relationship to the lighting system and wherein the second module has a lead extending externally of the second module for electrical connection to a lead from the test switch by means of electrical connectors located on the respective leads, the first module having means for electrically connecting to the electrical connector located on the lead extending from the test switch and a lead extending from the first module and having an electrical connector located on said lead, the lead from the second module connecting to the lead from the first module through respective electrical connectors, the first module being insertible between the second module and the test switch as an add-on without modification of the second module or of the electrical lighting system.

3. In the emergency lighting system of claim 2 wherein the first module electrically connects circuitry within the second module to the test switch.

4. In the emergency lighting system of claim 2 wherein the testing circuitry contained within the first module comprises means for determining the operational status of the inverter circuit.

5. In the emergency lighting system of claim 2 wherein the circuit contained within the second module comprises means for controlling charging of the battery, the testing circuit contained within the first module comprising means for determining the operational status of the controlling means.

6. In the emergency lighting system of claim 5 wherein the circuit contained within the second module comprises means for inferring AC line voltage and charge current from voltage differential sensed at the connection between the inverter circuit and the test circuitry contained within the module.

7. In the emergency lighting system of claim 5 wherein the inverter circuit comprises a relay having relay coils, the improvement further comprising means for sensing AC line voltage through the relay coils, said AC line voltage sensing means being disposed within the first-mentioned module.

8. In the emergency lighting system of claim 7 wherein the improvement further comprises means for inferring charge current through inferred voltage and through the characteristics of the relay.

9. An emergency lighting system having at least one lighting fixture and being comprised of modular units, a first modular unit comprising a battery pack having a battery and an inverter circuit for converting direct current provided by the battery to alternating current to power the lighting fixture in the event of failure of mains power, a second modular unit comprised of a test switch for manual actuation to initiate testing of system components contained within the first modular unit, and a third modular unit containing circuitry capable of controlling diagnostic, charge and transfer functions necessary to operation of the battery pack contained within the first modular unit, the circuitry being actuated by manipulation of the test switch of the second module or by automatic operation to perform predetermined testing and/or diagnostic functions, and means for electrically and physically connecting the third modular unit to the first and second modular units, the third modular unit taking the form of an add-on to the lighting system and being insertible between the first and second modular units and being functional therewith without modification or alteration of said first and second modular units.

10. The emergency lighting system of claim 9 wherein the inverter circuit contained within the first modular unit is disposed in operational relation to the lighting system and wherein the last-mentioned means comprise electrical leads extending between the modular units and electrical connectors terminating the electrical leads to electrically and physically connect the modular units together.

* * * * *